United States Patent
Sandell

(10) Patent No.: US 11,515,872 B1
(45) Date of Patent: Nov. 29, 2022

(54) ACTIVE GATE DRIVER OPTIMISATION WITH ENVIRONMENTAL VARIABLES

(71) Applicant: Kabushiki Kaisha Toshiba, Tokyo (JP)

(72) Inventor: Magnus Stig Torsten Sandell, Bristol (GB)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 17/454,866

(22) Filed: Nov. 15, 2021

(51) Int. Cl.
| | |
|---|---|
| H03K 17/00 | (2006.01) |
| H03K 17/16 | (2006.01) |
| H03K 17/082 | (2006.01) |
| H03K 17/042 | (2006.01) |

(52) U.S. Cl.
CPC ..... *H03K 17/166* (2013.01); *H03K 17/04206* (2013.01); *H03K 17/0822* (2013.01)

(58) Field of Classification Search
None
See application file for complete search history.

(56) References Cited

U.S. PATENT DOCUMENTS

| | | | | |
|---|---|---|---|---|
| 10,846,366 | B1* | 11/2020 | Otterbach | G06F 17/17 |
| 2020/0372094 | A1* | 11/2020 | Shehab | G06F 17/11 |
| 2022/0198253 | A1* | 6/2022 | Benosman | G06N 3/0635 |

FOREIGN PATENT DOCUMENTS

| | | |
|---|---|---|
| GB | 2 440 771 A | 2/2008 |
| WO | WO 2018/225083 A1 | 12/2018 |

OTHER PUBLICATIONS

Dymond et al., "A 6.7-GHz Active Gate Driver for GaN FETs to Combat Overshoot, Ringing, and EMI", IEEE Transactions on Power Electronics, vol. 33, No. 1, Jan. 2018, pp. 581-594, doi: 10.1109/TPEL.2017.2669879.

Miyazaki et al., "General-Purpose Clocked Gate Driver IC With Programmable 63-Level Drivability to Optimize Overshoot and Energy Loss in Switching by a Simulated Annealing Algorithm", IEEE Transactions on Industry Applications, vol. 53, No. 3, May/Jun. 2017, pp. 2350-2357, doi: 10.1109/TIA.2017.2674601.

Frazier "A Tutorial on Bayesian Optimization", arXiv [stat.ML], http://arxiv.org/abs/1 807.02811, 2018, 22 pages.

(Continued)

*Primary Examiner* — Tuan T Lam
(74) *Attorney, Agent, or Firm* — Oblon, McClelland, Maier & Neustadt, L.L.P.

(57) ABSTRACT

A method for active gate driving a switching circuit, wherein: a characteristic of a waveform controlled by the switching circuit is represented by a function mapping an input variable to an output metric, and wherein: the input variable comprises: a design variable having a first set of possible values; and an environmental variable having a second set of possible values, wherein the environmental variable is observable but not controllable. The method comprising: performing Bayesian optimisation on the function to generate a model of the function, wherein a next value of the design variable for evaluating the function is selected based on values of an acquisition function associated with a predicted value of the environmental variable; determining a first value of the design variable that optimises the model of the function; and controlling the switching circuit according to the first value of the design variable.

20 Claims, 8 Drawing Sheets

(56) References Cited

OTHER PUBLICATIONS

Moradpour et al., "Multi-Objective Optimization of the Gate Driver Parameters in a SiC-Based DC-DC Converter for Electric Vehicles", Energies 2020, 13, 3720, 14 pages, httlgs://doi.org/10.3390/en13143720.

* cited by examiner

ACTIVE GATE DRIVER OPTIMISATION WITH ENVIRONMENTAL VARIABLES

FIELD

Embodiments described herein relate generally to a method and device for active gate driving a switching circuit.

BACKGROUND

A Gate Driver (GD) is an electronic circuit that is used to drive (i.e. control the behaviour of) a switching device such as a MOSFET (Metal-Oxide-Semiconductor Field-Effect Transistor). One use-case for Gate Driver's (GDs) is for switching power electronic devices (i.e. for switching power semiconductor devices that control the application of a high voltage and/or high current to a load).

Known Gate Drivers apply a first voltage (e.g. 5 Volts) to a gate of the switching device to turn the switching device 'on' and apply a second voltage (e.g. 0 Volts) to the gate of the switching device to turn the switching device 'off'. Using a single step waveform for controlling the switching device has been found to cause sub-optimal switching waveforms. For example a single step waveform can cause a large overshoot in the Drain-Source current/voltage waveform.

Another approach is to use an Active Gate Driver (AGD) where the voltage waveform applied to the gate of the switching device is shaped in order to improve switching characteristics. For example, the waveform may be shaped to reduce an amount of current overshoot when switching the device 'on'.

Optimisation techniques have been used to find a specific gate driver waveform that optimises a metric such as current overshoot. These techniques rely on being able to control the input variables in order to build a model of how the metric (e.g. the current overshoot) varies with different input variables (e.g. with different gate switching waveforms). Once the model has been established it is possible to determine a set of input variables (e.g. a switching waveform) that optimises the metric (e.g. minimises the current overshoot).

As well as the gate driver waveform, the environmental variables (e.g. temperature and/or supply voltage) that the switching device experiences can also effect the switching performance. However, previous optimisation techniques cannot be used with models that include environmental variables as an input because these variables are observable but generally not controllable (e.g. it is not generally possible to control the temperature that the electronic device experiences). Omitting environmental variables from the model limits the model's accuracy and may result in a non-optimum waveform being selected as the optimum. In light of this, a new approach to optimising Active Gate Driver (AGD) waveforms is required that considers environmental variables.

Arrangements of embodiments will be understood and appreciated more fully from the following detailed description, made by way of example only and taken in conjunction with drawings in which.

DETAILED DESCRIPTION

Figure 1A:
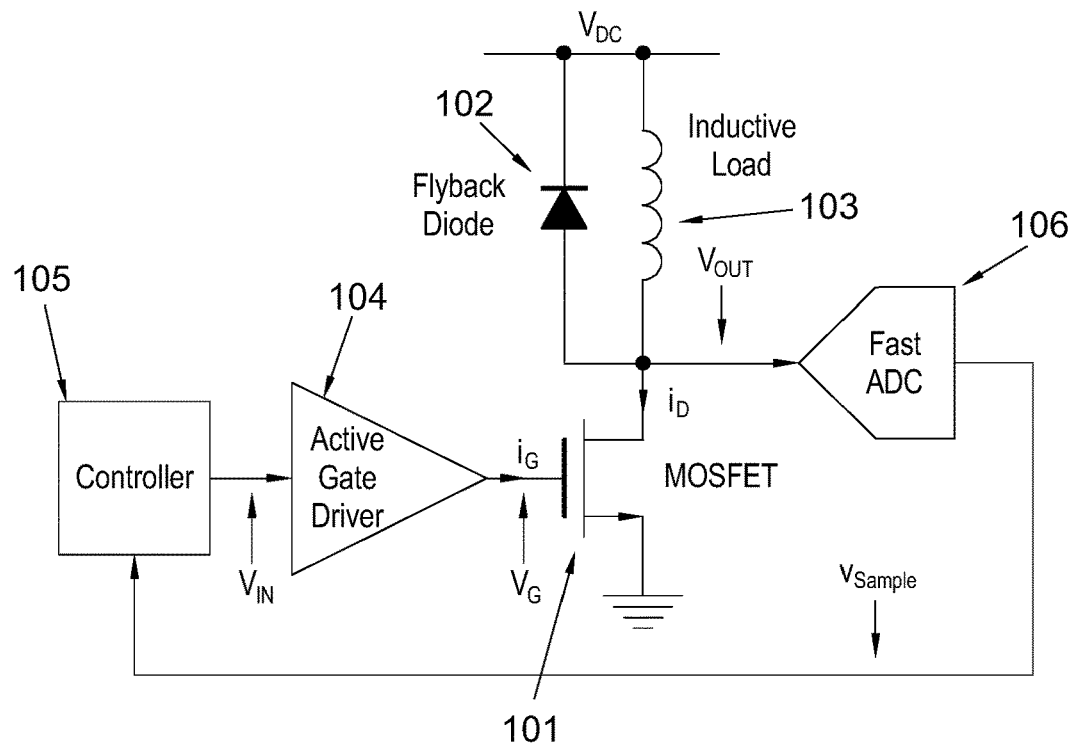
FIG. 1A shows an electronic system according to an example.

According to a first aspect there is provided a method for active gate driving a switching circuit, wherein a characteristic of a waveform controlled by the switching circuit is represented by a function mapping an input variable to an output metric, wherein: the input variable comprises: a design variable having a first set of possible values; and an environmental variable having a second set of possible values, wherein the environmental variable is observable but not controllable. The method comprising: performing Bayesian optimisation on the function to generate a model of the function, wherein a next value of the design variable for evaluating the function is selected based on values of an acquisition function associated with a predicted value of the environmental variable; determining a first value of the design variable that optimises the model of the function; and controlling the switching circuit according to the first value of the design variable.

In an embodiment the function is unknown.

In an embodiment the characteristic of the waveform controlled by the switching circuit is a property present in the switching waveforms, wherein the switching waveforms comprise a voltage waveform and/or a current waveform that is modified by controlling the switching circuit.

In an embodiment the model of the function models the function and comprises a mapping from the input variable to the output metric.

In an embodiment the design variable is controllable.

In an embodiment optimises includes minimises.

In an embodiment active gate driving includes applying a customisable waveform to an input of an electrical switch. Controlling includes driving the gate of the switching circuit.

In an embodiment the next value of the design variable is selected based solely on the values of the acquisition function associated with the predicted value of the environmental variable.

In an embodiment the model of the function comprises a mapping from: each combination of the first set of possible values and the second set of possible values, to: the output metric.

In an embodiment the mapping is a one to one mapping, or a unique mapping.

In an embodiment the mapping is a many to one mapping.

In an embodiment the output metric is one of: a current overshoot, a voltage overshoot, or a switching energy loss.

In an embodiment the design variable comprises information identifying a switching waveform;

In an embodiment the information identifying the switching waveform comprises: a first level, a first time, a second level and a second time In an embodiment the first level has a level in a set of levels, wherein each level in the set of levels is associated with a gate voltage.

In an embodiment the first time and the second time are specified with nanosecond precision.

In an embodiment the switching circuit comprises a MOSFET and wherein the switching waveform is a voltage waveform applied to a gate of the MOSFET.

In an embodiment controlling the switching circuit according to the first value of the design variable comprises: generating the voltage waveform based on the second value of design variable; and applying the voltage waveform to the gate of the MOSFET.

In an embodiment the MOSFET comprises a drain and a source, and wherein the current overshoot is an overshoot in the drain-source current, the voltage overshoot is an overshoot in the drain-source voltage and wherein the switching energy loss is the energy dissipated by the MOSFET during switching.

In an embodiment the source of the MOSFET is connected to earth, the drain of the MOSFET is connected to a first terminal of an inductive load and a second terminal of the inductive load is connected to a power supply.

In an embodiment performing Bayesian optimisation on the function to generate a model of the function, comprises: generating a prior probability distribution of the function by modelling the behaviour of the switching circuit as a Gaussian process; evaluating the function with a second value of the design variable and a first value of the environmental variable to generate a first evaluation; generating a posterior probability distribution of the function based on the prior probability distribution and the first evaluation; generating an acquisition function based on the posterior probability distribution, wherein the acquisition function comprises an indication of how an input space, comprising each combination of the first set of possible values and the second set of possible values should be explored; determining the next value of the design variable by maximising the acquisition function based on the predicted value of the environmental variable; evaluating the function with the next value of the design variable and a second value of the environmental variable to generate a second evaluation; and updating the posterior probability distribution of the function based on the second evaluation.

In an embodiment the second value of the design variable is randomly selected from the first set of possible values.

In an embodiment evaluating the function with the second value of the design variable and the first value of the environmental variable to generate the first evaluation comprises: generating a gate drive signal based on the second value of the design variable; applying the gate drive signal to an input of the switching circuit; sampling an output of the switching circuit to generate a sampled output; determining the output metric based on the sampled output; and setting the first evaluation equal to the output metric.

In an embodiment the first value of the environmental variable is implicitly inputted into the function.

In an embodiment determining the metric comprises determining a current overshoot, a voltage overshoot, and/or a switching energy loss.

In an embodiment the method further comprises observing the first value of the environmental variable with a sensor when applying the gate drive signal to the input of the switching circuit.

Optionally, observing comprises measuring.

In an embodiment the metric is based on a combination of a current overshoot and a switching energy loss.

In an embodiment the metric is based on the sum of the current overshoot and the switching energy loss.

In an embodiment the metric is based on the Root Mean Square of the current overshoot and the switching energy loss.

In an embodiment generating a prior probability distribution of the function comprises determining, for each combination of the first set of possible values and the second set of possible values, a probability distribution of the values that the function could take at the respective point.

In an embodiment the prior probability distribution comprises a mean function comprising an entry for each combination of the first set of possible values and the second set of possible values.

In an embodiment the prior probability distribution comprises a first mean and a first standard deviation associated with a first combination of the first set of possible values and the second set of possible values;

In an embodiment the acquisition function indicates an expected improvement in the output metric associated with each combination of the first set of possible values and the second set of possible values relative to a current combination of the first set of possible values and the second set of possible values associated with a lowest output metric. Optionally, an improved value is a lower value.

In an embodiment determining the next value of the design variable comprises determining a first set of values of the acquisition function associated with the predicted value of the environmental variable; identifying a value in the first set of values associated with a lowest value; and setting the next value of the design variable equal to a value of the design variable associated with the highest value.

In an embodiment the predicted value of the environmental variable is the first value of the environmental variable.

In an embodiment the predicted value of the environmental variable is the last recorded value of the environmental variable.

In an embodiment the predicted value of the environmental variable is generated using a predictive model based on previous values of the environmental variable.

In an embodiment determining the first value of the design variable that optimises the model of the function comprises: identifying a minimum value of a mean function associated with the model of the function; and setting the first value of the design variable equal to a design variable associated with the minimum value of the mean function.

In an embodiment the method further comprises determining whether a number of function evaluations is greater than a predetermined threshold number of function evaluations; and in response to determining that the number is greater than the predetermined threshold: determining the first value of the design variable that optimises the model of the function; and controlling the switching circuit according to the first value of the design variable.

In an embodiment the posterior probability distribution comprises a mean and a covariance matrix for each combination of the first set of possible values and the second set of possible values; and wherein; generating a posterior probability distribution of the function based on the prior probability distribution and the first evaluation comprises: setting a first mean associated with the second value of the design variable and the first value of the environmental variable equal to the first evaluation; and setting a first covariance matrix associated with the second value of the design variable and the first value of the environmental variable equal to zero.

In an embodiment the method further comprises generating a conditional probability for each combination of the first set of possible values and the second set of possible values apart from the second value of the design variable and the first value of the environmental variable based on the first evaluation using Bayes' rule.

In an embodiment the acquisition function indicates a probability of improvement in the output metric associated with each combination of the first set of possible values and the second set of possible values relative to a current combination of the first set of possible values and the second set of possible values associated with a lowest output metric.

In an embodiment the first set of possible values comprises a first value and a second value and the second set of possible values comprises a third value and a fourth value and wherein each combination of the first set of possible values and the second set of possible values comprises: the first value and the third value, the first value and the fourth value, the second value and the third value, the second value and the fourth value.

According to a second aspect there is provided a device for active gate driving a switching circuit, wherein: a characteristic of a waveform controlled by the switching circuit is represented by a function mapping an input variable to an output metric, wherein: the input variable comprises: a design variable having a first set of possible values; and an environmental variable having a second set of possible values, wherein the environmental variable is observable but not controllable; the device configured to: perform Bayesian optimisation on the function to generate a model of the function, wherein the device is configured to select a next value of the design variable for evaluating the function based on values of an acquisition function associated with a predicted value of the environmental variable; determine a first value of the design variable that optimises the model of the function; and control the switching circuit according to the first value of the design variable.

Optionally the device is the controller 402. Optionally, the device controls the switching circuit via active gate driver 401.

In an embodiment the device is configured to select the next value of the design variable based solely on the values of the acquisition function associated with the predicted value of the environmental variable.

In an embodiment the model of the function comprises a mapping from: each combination of the first set of possible values and the second set of possible values, to: the output metric.

In an embodiment the output metric is one of: a current overshoot, a voltage overshoot, or a switching energy loss.

In an embodiment the design variable comprises information identifying a switching waveform; In an embodiment the switching circuit comprises a MOSFET and wherein the switching waveform is a voltage waveform applied to a gate of the MOSFET.

In an embodiment the device is further configured, when performing Bayesian optimisation on the function to generate a model of the function, to: generate a prior probability distribution of the function by modelling the behaviour of the switching circuit as a Gaussian process; evaluate the function with a second value of the design variable and a first value of the environmental variable to generate a first evaluation; generate a posterior probability distribution of the function based on the prior probability distribution and the first evaluation; generate an acquisition function based on the posterior probability distribution, wherein the acquisition function comprises an indication of how an input space, comprising each combination of the first set of possible values and the second set of possible values should be explored; determine the next value of the design variable by maximising the acquisition function based on the predicted value of the environmental variable; evaluate the function with the next value of the design variable and a second value of the environmental variable to generate a second evaluation; and update the posterior probability distribution of the function based on the second evaluation.

In an embodiment the device is further configured, when evaluating the function with the second value of the design variable and the first value of the environmental variable, to: generate a gate drive signal based on the second value of the design variable; apply the gate drive signal to an input of the switching circuit; sample an output of the switching circuit to generate a sampled output; determine the output metric based on the sampled output; and set the first evaluation equal to the output metric.

In an embodiment the metric is based on a combination of a current overshoot and a switching energy loss.

In an embodiment the device is further configured, when generating a prior probability distribution of the function to: determine, for each combination of the first set of possible values and the second set of possible values, a probability distribution of the values that the function could take at the respective point.

In an embodiment the acquisition function indicates an expected improvement in the output metric associated with each combination of the first set of possible values and the second set of possible values relative to a current combination of the first set of possible values and the second set of possible values associated with a lowest output metric.

In an embodiment the device is further configured, when determining the next value of the design variable to: determine a first set of values of the acquisition function associated with the predicted value of the environmental variable; identify a value in the first set of values associated with a lowest value; and set the next value of the design variable equal to a value of the design variable associated with the highest value.

In an embodiment the predicted value of the environmental variable is the first value of the environmental variable.

In an embodiment wherein the device is further configured, when determining the first value of the design variable that optimises the model of the function, to: identify a minimum value of a mean function associated with the model of the function; and set the first value of the design variable equal to a design variable associated with the minimum value of the mean function.

According to a third aspect there is provided a non-transitory computer-readable medium comprising computer program instructions suitable for execution by a processor, the instructions configured, when executed by the processor, to: perform Bayesian optimisation on a function to generate a model of the function, wherein a next value of a design variable for evaluating the function is selected based on values of an acquisition function associated with a predicted value of an environmental variable; determine a first value of the design variable that optimises the model of the function; and control a switching circuit according to the first value of the design variable, wherein: a characteristic of a waveform controlled by the switching circuit is represented by the function mapping an input variable to an output metric, and wherein: the input variable comprises: the design variable having a first set of possible values; and the environmental variable having a second set of possible values, wherein the environmental variable is observable but not controllable.

According to a fourth aspect there is provided a system comprising: a device as discussed above; an active gate driver comprising an input coupled to an output of the device; and an electrical switch comprising a first input coupled to a first output of the active gate driver; wherein: the device is further configured output the first value of the design variable; the active gate driver is configured to output a switching waveform based on the first value of the design variable; and the electrical switch is configured to control the waveform based on the switching waveform applied to the first input of the electrical switch.

In an embodiment the system further comprises a sensor configured to sample the waveform, wherein the sensor comprises a second output coupled to the device.

FIG. 1A shows an electronic system according to an example. FIG. 1A shows an electronic system comprising a switching device 101 in the form of a MOSFET (Metal-Oxide-Semiconductor Field-Effect Transistor). The MOSFET comprises a gate, a drain and a source. The source is coupled to earth. The drain is coupled to an inductive load 103. The inductive load 103 is coupled between the drain of the MOSFET and a supply voltage ($V_{DC}$). Optionally, the electronic system comprises a flyback diode 102 coupled (at its anode) to the drain of the MOSFET and coupled (at its cathode) to the supply voltage ($V_{DC}$).

The electronic system also comprises an Active Gate Driver 104 comprising an input and an output. The input of the Active Gate Driver 104 is coupled to a controller 105 and the output of the Active Gate Driver 104 is coupled to the gate of switching device 101. The Active Gate Driver 104 is configured to receive an input voltage signal ($V_{IN}$) and output a gate drive waveform ($V_G$) that is based on the received input voltage signal ($V_{IN}$).

As discussed above, the characteristics of the switching waveforms depend on the gate drive waveform. For example, a single step gate drive waveform can result in a large drain-source current overshoot when turning the switching device 101 on.

Figure 1B:
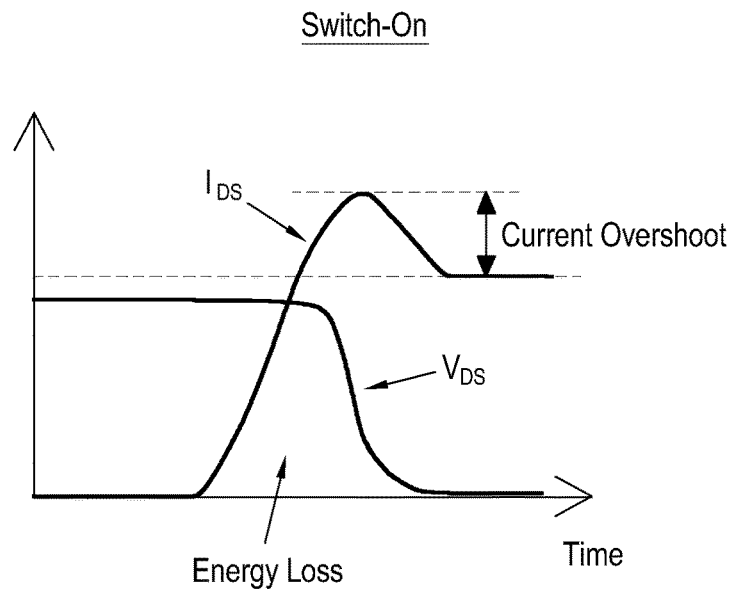
FIG. 1B shows switching waveforms of a switching device according to an example.

FIG. 1B shows switching waveforms of a switching device according to an example. In particular, FIG. 1B shows the Drain-Source current waveform ($I_{DS}$) and the Drain-Source voltage waveform ($V_{DS}$) during a switch-on of a MOSFET.

During switch-on a voltage is applied to the gate of the switching device 101. A conductive channel between the Drain and the Source is formed when the Gate-Source voltage ($V_{GS}$) of the switching device 101 exceeds a threshold value. Once the conductive channel is formed the Drain-Source voltage ($V_{DS}$) will be 0 Volts (or just slightly above to account for a drain-source on-state resistance). However, the change in the current and voltage waveform is not instantaneous due, in part, to the parasitic capacitances of the MOSFET. As a result, there is a period of time where both the Drain-Source current ($I_{DS}$) and the Drain-Source voltage ($V_{DS}$) are non-zero. During this time the switching device 101 dissipates the resulting power. The power dissipated during this time is referred to as the switching loss. One way to calculate the switching loss is to determine the integral of the Drain-Source current ($I_{DS}$) waveform, and the Drain-Source ($V_{DS}$) voltage waveform. FIG. 1B shows an example of the energy loss during a switch-on event.

Another effect that can observed in the switching waveforms is an overshoot in the Drain-Source current ($I_{DS}$) waveform during a switch-on event and/or an overshoot in the Drain-Source voltage ($V_{DS}$) during a switch-off event. The overshoot arises during a switching event before the current/voltage settles to a steady state. FIG. 1B shows an example of the current overshoot in the Drain-Source current ($I_{DS}$) during a switch-on event. A value of the current overshoot can be calculated according to a difference between a peak current and a current value in the steady state (e.g. after the switch, when the switching device 101 is in the on state).

It is desirable to avoid switching losses to improve energy efficiency. It is also desirable to reduce overshoot to avoid damaging the components. In light of this the Active Gate Driver 104 can be used to generate a gate drive waveform ($V_G$) that minimises one of these effects in the switching waveforms.

In the system of FIG. 1A a Fast Analogue-to-Digital Converter 106 is provided to sample (i.e. measure) the drain voltage ($V_D$) of the switching device 101. Also provided is a current sensor (not shown) configured to sample the drain current ($I_D$) of the switching device 101. Samples from the Fast Analogue-to-Digital Converter 106 and the current sensor (not shown) are communicated to the controller 105, which is configured to determine a metric (e.g. current overshoot, voltage overshoot and/or energy loss) of a switching event (e.g. switch-on or switch-off) based on the received samples.

In an example, the controller 105 is configured to implement an optimisation algorithm in order to obtain a gate drive waveform ($V_G$) that minimise the measured metric. The electronic system shown in FIG. 1A has a number of properties that limit the choice of optimisation algorithm.

Firstly, measuring the metric (e.g. the current overshoot, the voltage overshoot, and/or the switching loss) can take a long time. That is to say the function ($f(x)$) that maps the gate drive waveform ($V_G$) to the metric (e.g. the current overshoot) is "expensive to evaluate". As a result optimisation must be performed on a small number of observations. Secondly, the internal behaviour of the switching device 101 is difficult to model or predict. As a result, the switching device can be regarded as a "black box" where there is no a priori information about how the inputs (e.g. the gate drive waveform ($V_G$)) are mapped to the metric (e.g. the current overshoot)). Finally, the optimisation algorithm should be able to find a "global" optimum (as opposed to a local optimum).

Consequently, Active Gate Driver (AGD) optimisation can be classified as "global optimisation of a black-box function which is expensive to evaluate".

An example of an optimisation technique that is suitable for "global optimisation of a black-box function which is expensive to evaluate" is Bayesian Optimisation. In FIG. 1A the controller 105 is configured to use Bayesian Optimisation to determine a gate driver waveform ($V_G$) that minimises a metric (e.g. current overshoot, voltage overshoot, and/or switching loss).

A brief description of Bayesian Optimisation is provided below. However, a more detailed review is provided in "Frazier, P. I. (2018) 'A Tutorial on Bayesian Optimization', arXiv [stat.ML]. Available at: http://arxiv.org/abs/1807.02811", which is incorporated herein by reference.

Figure 2:
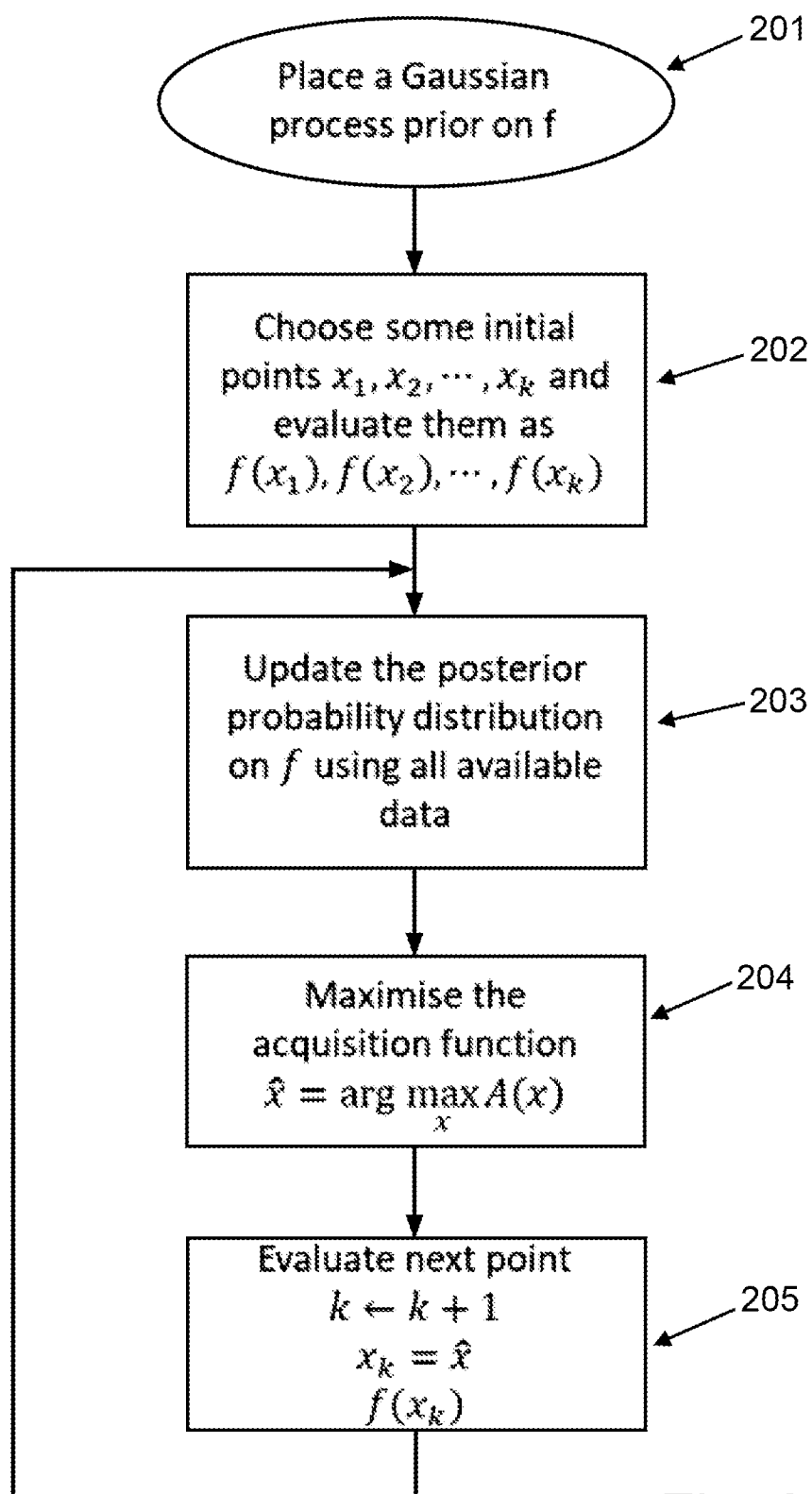
FIG. 2 shows a known method of Bayesian Optimisation.

FIG. 2 shows a known method of Bayesian Optimisation. The aim of Bayesian Optimisation is to optimise a function, $f(x)$, and is typically used on problems of the form $$\min_{x \in S} f(x)$$

(i.e. to find a minimum of the function, $f$), where S is a set of points whose membership can easily be evaluated.

Where Bayesian Optimisation is used for Active Gate Driver (AGD) optimisation, the objective function (i.e. the function we wish to maximise or minimise), $f$, is a function that maps information representing the gate driver signal, x, (i.e. the independent variable) to a metric such as: the current overshoot, the voltage overshoot and/or the switching loss.

Bayesian Optimisation comprises a number of stages. Initially the objective function, $f$, is unknown. That is to say, before starting the method there is no information about how the metric (e.g. current overshoot) varies with the input (e.g. the gate driver signal). A first stage of Bayesian Optimisation includes generating a model of the (unknown) objective function, $f$, by making observations. This model is known as the "surrogate model". Once the model has been generated a value of the input variables is found that optimises the measured metric (for example, by finding a gate driver signal that minimises the current overshoot).

The method begins in step 201 by placing a Gaussian Process prior probability distribution (also referred to as a 'prior') on the (unknown) objective function, $f$. A prior probability distribution is a probability distribution before any evaluations (or equivalently observations) are considered. A Gaussian process provides a posterior probability distribution that describes potential values for the objective function, $f$, at each candidate point, x. Put in other words, a Gaussian process is a probability distribution over possible functions that fit a set of points (which, in this case is the (unknown) objective function, $f$). Consequently, placing a Gaussian Process prior on the objective function, $f$, (or equivalently modelling the objective function, $f$, as a Gaussian process) generates a probability distributions of potential values that the objective function, $f$, could take at each candidate point x.

By way of analogy, step 201 involves generating an infinite number of possible functions that could correspond to the (unknown) objective function, $f$, and creating a probability distribution of the function values at each candidate point, x. It will be appreciated that these and subsequent analogies are provided for helping the reader visualise the method of Bayesian Optimisation and implementing step 201 would not necessarily require an infinite number of possible functions to be assembled.

Step 201 can be implemented mathematically as follows. Consider the values of the objective function, $f$, as a finite collection of points: $x_1, \ldots, x_k \in \mathbb{R}^d$, where d is the dimensions of the input space. In this case, the value of the objective function, $f$, at these points can be collected into a vector as: $[f(x_1), \ldots, f(x_k)]$.

This vector is an unknown quantity. Like with other approaches in Bayesian statistics, it is assumed that the unknown quantity was drawn at random by nature from some prior probability distribution. Bayesian Optimisation considers this prior distribution to be multivariate normal, with a particular mean vector and covariance matrix.

The covariance matrix is generated by evaluating the covariance function (or kernel), $\Sigma_0$, at each pair of points ($x_i$, $x_j$). The choice of covariance function is predefined and influences the resulting probability distribution at each point. Possible Kernels include the power exponential or Gaussian kernel. Adjusting the parameters of the kernel or changing the kernel itself changes the beliefs about the objective function, $f$. For example, how quickly the objective function, $f$, changes with changes to the input, x.

The resulting prior probability distribution on $[f(x_1), \ldots, f(x_k)]$ is:

$$f(x_{1:k}) \sim \text{Normal}(\mu_0(x_{1:k}), \Sigma_0(x_{1:k}, x_{1:k}))$$

Where $\mu_0$ is a mean function and $\Sigma_0$ is a covariance function (otherwise referred to as a kernel) and where compact notation is used for functions applied to collections of input points such that: $x_{1:k}$ indicates the sequence $x_1, \ldots, x_k$, $f(x_{1:k})=[f(x_1), \ldots, f(x_k)]$, $\mu_0(x_{1:k})=[\mu_0(x_1), \ldots, \mu_0(x_k)]$ and $\Sigma_0(x_{1:k}, x_{1:k})=[\Sigma_0(x_1, x_1), \ldots, \Sigma_0(x_1, x_k); \ldots; \Sigma_0(x_k, x_1), \ldots, \Sigma_0(x_k, x_k)]$.

Although in the above example the objective function, $f$, is modelled on a finite number of points, it will be appreciated that the same approach can be used when modelling the objective function, $f$, over a continuous domain.

Further techniques for modelling the objective function, $f$, as a Gaussian process prior (i.e. implementing step 201) are described in "Rasmussen, C. and Williams, C. (2006). Gaussian Processes for Machine Learning. MIT Press, Cambridge, Mass.", which is incorporated herein by reference.

The method of FIG. 2 will be discussed with reference to an example where a one-dimensional (i.e. d=1) objective function, $f$, is optimised. However it is emphasised, for the avoidance of any doubt, that the techniques described herein can be applied to a multi-dimensional objective function, $f$, (i.e. d>1).

Figure 3A:
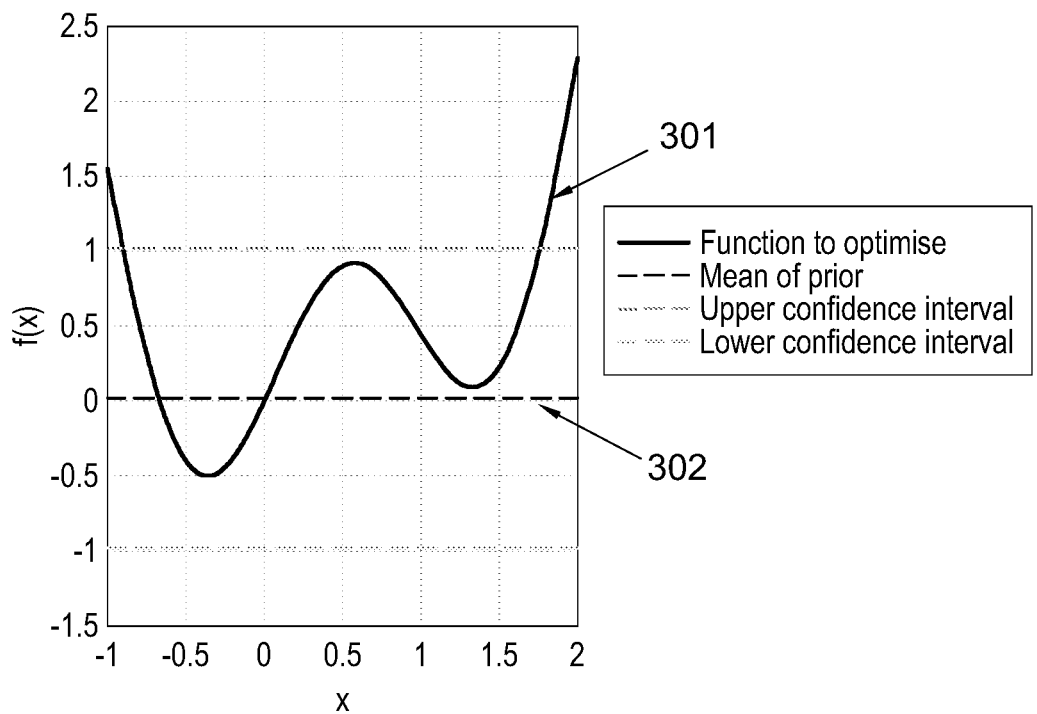
FIG. 3A shows an example prior probability distribution.

FIG. 3A shows an example prior probability distribution. In particular, FIG. 3A shows a function to optimise 301 (i.e. the function which the method of FIG. 2 models and subsequently determines a value that optimises the model). The function to optimise is also referred to as the objective function, $f$. In Active Gate Driver (AGD) optimisation, the function to optimise 301 could be the function that maps the input gate driver signal to the observed metric (e.g. current overshoot). For the avoidance of doubt it is emphasised that the function to optimise 301 (i.e. the objective function, $f$) is unknown and is included in the figures to show how successive iterations of the Bayesian Optimisation algorithm generate a surrogate model that approximates this function.

As discussed above, in step 201 no information is known about the objective function, $f$. As a result, the prior probability reflects the beliefs about the objective function, $f$. In particular, FIG. 3A shows that the prior probability of function values at each point (i.e. each x) has a same mean, shown by a mean function 302, and a same standard deviation shown by the upper and lower confidence intervals in FIG. 3A (which are set as the mean plus/minus the standard deviation). FIG. 3A shows an example where the mean function, $\mu_0$, is constant (for all x). However, it will be appreciated that other mean functions could be used.

Returning to FIG. 2. In step 202 the method selects at least one initial point (e.g. random candidate points in the input space, $x_1, x_2, \ldots, x_k$) and evaluates the objective function, $f$, at these points. Thereby obtaining: $f(x_1), f(x_2), \ldots, f(x_k)$. This step is referred to as function evaluation, since the objective function, $f$, is evaluated for a given input.

Where the method of FIG. 2 is used for Active Gate Driver (AGD) optimisation, step 202 comprises choosing a point in the input space (e.g. a particular gate drive signal), apply the gate drive signal to the switching device 101, observing the switching waveforms (e.g. using a voltage sensor and/or a current sensor) and determining the metric (e.g. the current overshoot and/or the switching energy loss). Here the metric (e.g. the current overshoot) is equivalent to the data obtained by evaluating the objective function, $f$, with a given input (i.e. a given gate driver signal). As a reminder, the objective function, $f$, is a mapping that captures the behaviour of the switching circuit.

In an example the number of candidate points that are used to initially evaluate the objective function, $f$, is any number greater than zero. Optionally the candidate points are chosen at random. In an example the first k values are chosen at random to initialise the algorithm. As will be apparent from the description below, once the surrogate model has been updated using an observation, a subsequent point to evaluate can be found by optimising an acquisition function. As a result, it is possible to start the method of Bayesian optimisation with just k=1 values/candidate points.

The posterior probability distribution (i.e. the probability distribution of the objective function, $f$, when observations are taken into account) is subsequently updated after observing the objective function, $f$, at the initial points in the input space.

In step 203 the posterior probability distribution of the objective function, $f$, is updated based on the obtained function evaluations (either from step 202 or step 205 (as will be discussed further below)).

Figure 3B:
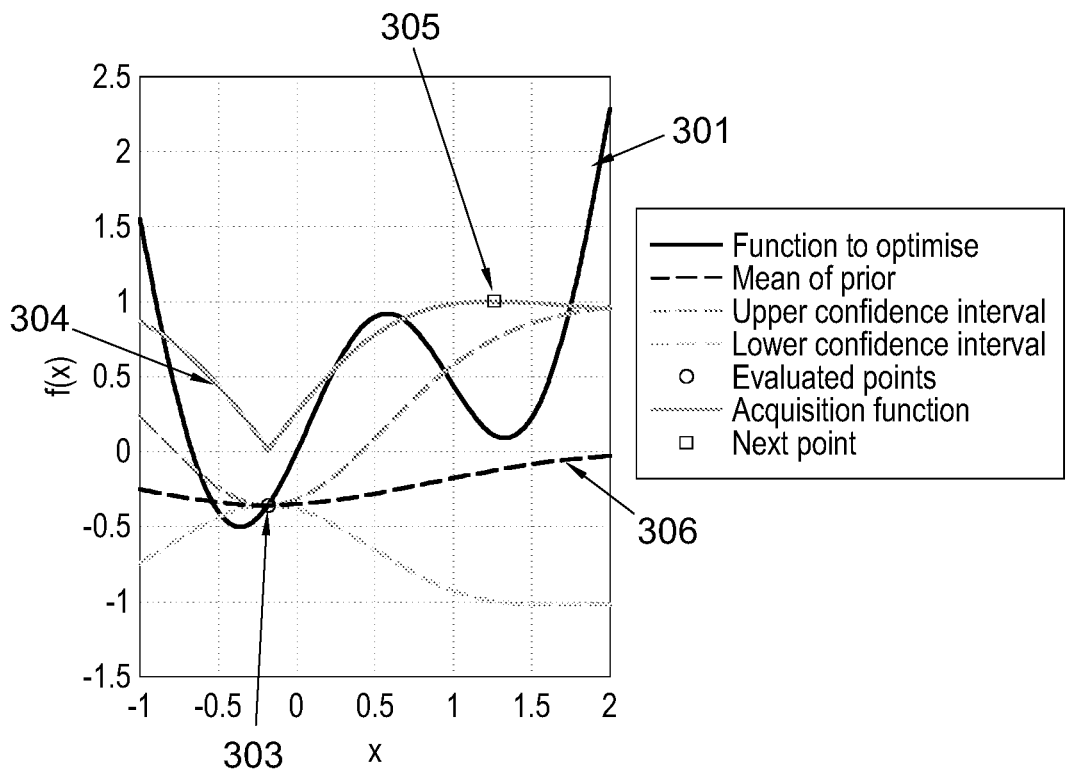
FIG. 3B shows an example posterior probability distribution of the surrogate model during a first iteration.

FIG. 3B shows an example posterior probability distribution of the surrogate model during a first iteration. FIG. 3B uses same reference numerals as FIG. 3A to denote same features. As a result, a detailed discussion will be omitted.

A first point 303 is evaluated in step 202 (i.e. the point $x_1$ is selected, and $f(x_1)$ is evaluated in step 202). At the first point 303, the mean of the posterior probability distribution (representing the surrogate model of the objective function, $f$), is set equal to the observed value of the metric, i.e. $\mu_0(x_1)=f(x_1)$. The standard deviation at the first point 303 in the surrogate model is also set equal to zero since it is assumed that this point on the objective function, $f$, is now known perfectly. As will be appreciated further when considering the multivariate case below, this step is equivalent to setting the covariance matrix equal to zero indicating no uncertainty since the function value is known exactly at the point that was just evaluated. This assumes a noise-free observation. However it will be appreciate that noise can be accounted for by using a non-zero standard deviation at the first point 303.

The remainder of the posterior probability distribution is updated after updating the posterior probability distribution at the first point 303 (i.e. at $x_1$). In particular, the conditional probability distribution of $f(x)$ for each x (apart from the evaluated points) is computed given the observation $f(x_1)$ using Bayes' rule.

By way of analogy, updating the posterior probability distribution comprises reducing the infinite number of possible functions generated in step 201 that could represent the objective function, $f$, to those functions that pass through the first point 303 and then regenerating the probability distribution of function values for each candidate point based on the reduced set of possible functions.

For the multivariate case step 203 can be implemented as follows.

Suppose we observe $f(x_{1:n})$ without noise at n and we wish to infer the value of $f(x)$ at a new point x. To do so, we let k=n+1 and $x_k$=x, so that the prior probability distribution over $[f(x_{1:n}),f(x)]$ is given by the equation discussed in relation to step 201. The conditional distribution of $f(x)$ is then calculated using Bayes' rule according to:

$$f(x)|f(x_{1:n}) \sim \text{Normal}(\mu_n(x), \sigma_n^2(x))$$

$$\mu_n(x) = \Sigma_0(x, x_{1:n}) \Sigma_0(x_{1:n}, x_{1:n})^{-1}(f(x_{1:n}) - \mu_0(x_{1:n})) + \mu_0(x)$$

$$\sigma_n^2(x) = \Sigma_0(x, x) - \Sigma_0(x, x_{1:n}) \Sigma_0(x_{1:n}, x_{1:n})^{-1} \Sigma_0(x_{1:n}, x)$$

This conditional distribution is referred to as the posterior probability distribution. The posterior mean $\mu_n(x)$ is a weighted average between the prior $\mu_0(x)$ and an estimate based on the data $f(x_{1:n})$, with a weight that depends on the kernel. The posterior variance $\sigma_n^2(x)$ is equal to the prior covariance $\Sigma_0(x,x)$ less a term that corresponds to the variance removed by observing $f(x_{1:n})$.

As can be seen from FIG. 3B a mean function 306 of the posterior probability distribution does not yet accurately model the objective function 301, $f$, (which is not known to the system). However, as will be apparent from the description below, the accuracy of the surrogate model improves as more candidate points are evaluated.

The posterior probability distribution (updated in step 203) is subsequently used to generate/update an acquisition function, A(x), 304 (also referred to as an infill sampling criteria) in step 204. The acquisition function 304 is used to determine the next query point. More specifically, the acquisition function is used to find the "best" next point to evaluate, where "best" depends on the type of the acquisition function that is used, examples of which are discussed further below. For example, when used in Active Gate Driver (AGD) optimisation, the acquisition function, A(x), 304 is used to determine the next gate driver signal to query (i.e. to apply to the switching device 101).

In an example determining the acquisition function, A(x), 304 includes estimating, based on the current posterior probability distribution over the objective function, $f$, the value of the objective function at a new point x. Various acquisition functions are known.

A first acquisition function is "probability of improvement". In probability of improvement an acquisition function is generated that indicates the probability of a point in the input space improving the current observed minimum (i.e. the minimum value obtained by evaluating the objective function, $f$). For example, in the case of FIG. 3B, the "probability of improvement" acquisition function provides an indication of the probability that a query point (i.e. a value of x) produces a better (i.e. lower) value than the current best output (i.e. which, in the example of FIG. 3B is the first point 303, $f(x_1)$). In this case the acquisition function is generated based on the posterior probability distribution. An analytical method for determining the "probability of improvement" acquisition function is described in: "Snoek, J. (2012). 'Practical Bayesian Optimization of Machine Learning Algorithms', arXiv [stat.ML]. Available at: https://arxiv.org/abs/1206.2944", which is incorporated herein by reference.

A second acquisition function is "expected improvement". Probability of improvement provides information about how likely an improvement is, but does not consider how much the improvement is by. In contrast to "probability of improvement", "expected improvement" combines the expected improvement with its probability to generate an acquisition function that indicates, for each query point in the input space (i.e. for each value of x), the expected improvement (over the current minimum evaluation) by evaluating the given point. Given the goal is to minimise the objective function, $f$, an improvement is a smaller value of the objective function, $f$. For example, in the case of FIG. 3B, the "expected improvement" acquisition function provides an indication of the expected improvement associated with evaluating each query point, relative to the current best point (i.e. the first point 303, $f(x_1)$). Expected improvement is discussed further in "Frazier, P. I. (2018) "A Tutorial on Bayesian Optimization", arXiv [stat.ML]. Available at: http://arxiv.org/abs/1807.02811", which is incorporated herein by reference.

Both of the acquisition functions discussed above can also include a parameter that controls the exploitation (i.e. improving the optimum by looking near the current optimum) vs. exploration (i.e. looking further away from the current optimum where the knowledge of the objective function, $f$, is low) when determining the next query point.

In the example above where the aim is to minimise a metric (e.g. the current overshoot), the acquisition function indicates the best next point to evaluate. Depending on the acquisition function, this could mean the most likely point to reduce the metric (e.g. the current overshoot) or the point that offers the largest expected reduction in the metric (e.g. the current overshoot). In either case, a value of the objective function, $f$, should be reduced by evaluating a point in the input space, x, associated with a maximum of the acquisition function.

Two types of activation function are discussed above. However it is emphasized, for the avoidance of any doubt, that many other acquisition functions could be used in Bayesian Optimisation.

After generating/updating the acquisition function based on the posterior probability distribution the method maximises the acquisition function. In particular, a value in the input space (i.e. a value of the variable x) that maximises the acquisition function, $$\max_x A(x),$$

is determined. FIG. 3B shows an acquisition function 304 and a next query point 305. The next query point 305 corresponds to a maximum of the acquisition function, A(x), 304 (i.e.

$$\operatorname{argmax}_x A(x))$$

After determining the next query point 305, the method proceeds to step 205.

In step 205 the next query point 305 is evaluated. That is to say, the value of the next query point is determined (i.e. $x_2$) and the objective function, $f$, is evaluated at the next query point (i.e. $f(x_2)$) to generate a second observation of the system.

In the context of an Active Gate Driver (AGD) optimisation, a gate driver signal corresponding to $x_2$ is used to switch the switching device, the switching waveforms (e.g. the current/voltage waveforms) are observed and the metric (e.g. current overshoot) is calculated to determine the data value $f(x_2)$.

The method subsequently proceeds to step 203. In step 203 the posterior probability distribution of the surrogate model is updated by setting the mean function at the query point $x_2$ equal to the data value $f(x_2)$, the standard deviation at the query point $x_2$ is set equal to zero and the conditional probability distribution of the remaining x values are updated using Bayes' rule as discussed above. The acquisition function 304 is subsequently updated based on the updated posterior probability distribution.

Figure 3C:
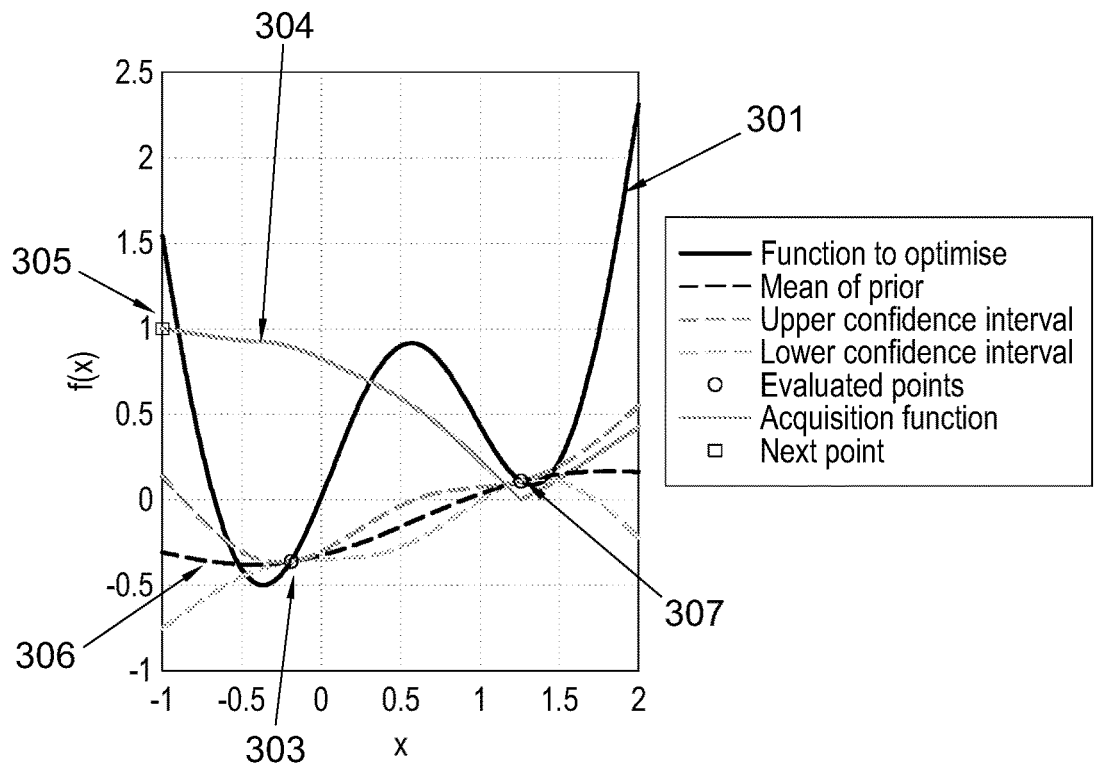
FIG. 3C shows an example posterior probability distribution of the surrogate model during a second iteration.

FIG. 3C shows an example posterior probability distribution of the surrogate model during a second iteration. In particular FIG. 3C shows a second point 307 generated by evaluating the objective function, $f$, with the next query point 305 from FIG. 3B (i.e. evaluating $f(x_2)$). At the second point 307 the mean function is set equal to the data value (i.e. $f(x_2)$) and the standard deviation is set equal to zero. The posterior probability distribution of $f$ (i.e. the shadow model) is subsequently updated as can be seen by the difference between the mean function of the posterior probability distribution 306 in FIG. 3B and FIG. 3C. The acquisition 304 is subsequently updated based on the updated posterior probability.

In step 204 the acquisition function, A(x), is maximised. That is to say, a value of x that maximises the acquisition function, A(x), is selected as the next query point 305.

The next query point 305 in FIG. 3C is $x_3$. In step 205 the method evaluates the objective function, $f$, at $x_3$ (i.e. $f(x_3)$). A third data point is obtained (i.e. $f(x_3)$). The method subsequently proceeds to step 203 where the posterior probability distribution is updated based on the third data point as discussed above. The acquisition function is updated based on the updated posterior probability distribution and the acquisition function is maximised to identify the next query point as discussed above.

Figure 3D:
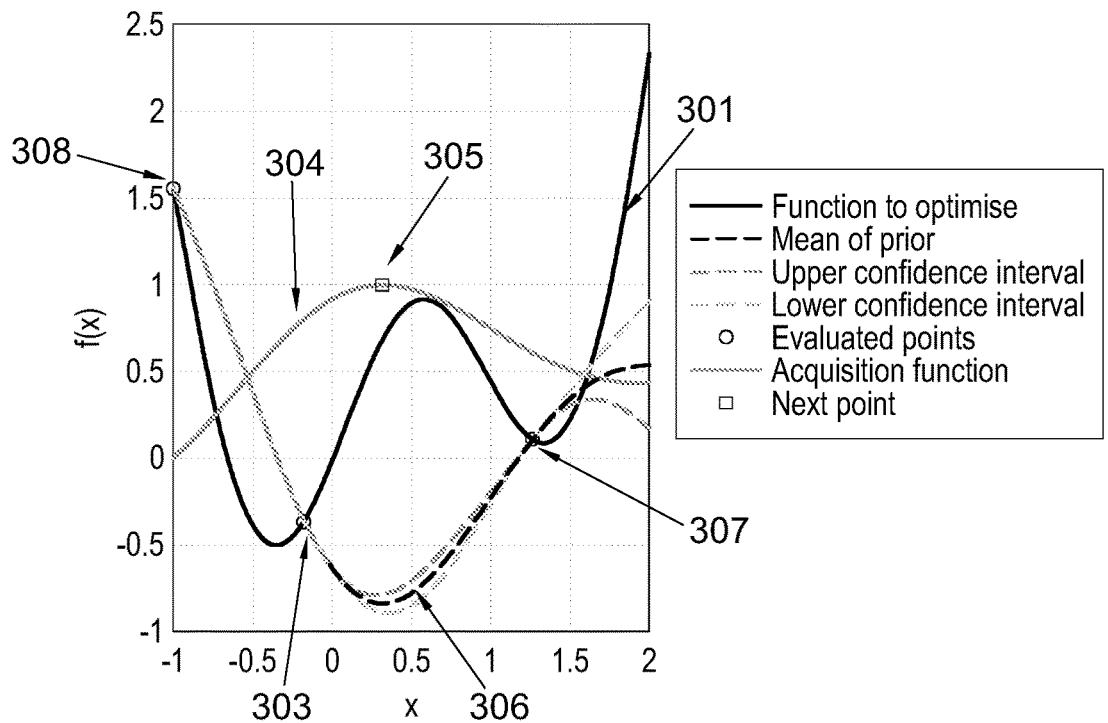
FIG. 3D shows an example posterior probability distribution of the surrogate model during a third iteration.

FIG. 3D shows an example posterior probability distribution of the surrogate model during a third iteration. In particular FIG. 3D shows a third data point 308 (i.e. $f(x_3)$) and an updated posterior probability distribution of $f$. FIG. 3D also shows an acquisition function updated according to the updated posterior probability distribution and a next query point 305 that is selected by maximising the acquisition function.

Although not shown in FIG. 2, after updating the posterior probability distribution of the objective function, $f$, in step 203 it is determined whether to stop updating the surrogate model. In one example the surrogate model is updated iteratively for N function evaluations (thereby generating N observations of the objective function, $f$). Once it is determined that a number of function evaluations performed by the method equals N, the surrogate model is no longer updated, and is instead optimised (i.e. maximised or minimised) to find a value of the input variables (e.g. a gate driver signal) that maximises or minimises the function (e.g. the current overshoot).

In the example discussed above, the only input variable that is considered during optimisation is the information identifying the gate driver signal (i.e. the voltage waveform applied to the gate of the switching device 101). The information identifying the gate drive signal is an example of a design variable. A design variable is a variable that an operator (e.g. the controller 105) can set to a desired value (within limits). For example, the gate drive signal can be controlled by changing the shape (i.e. the voltage vs. time characteristics) of the gate drive signal.

The performance of the Active Gate Driver (AGD) also depends on environmental variables. Environmental variables are variables that can be observed but not controlled. Environmental variables include, but are not limited to: temperature of the device, supply voltage and load current. These variables will affect the performance of the Active Gate Driver (AGD) but cannot (easily) be controlled.

For example it is not generally possible to control the temperature that the switching device experiences however the temperature does affect the performance of the switching device and can be observed (e.g. by a temperature sensor).

Other examples of environmental variables include the supply voltage and the load current. When the Active Gate Driver (AGD) is used in an electric vehicle, these values can depend on the operating mode of the vehicle (e.g. the values will be different when going up a hill compared to when on a flat road). It will be appreciated that the Active Gate Driver (AGD) cannot control whether the vehicle is going up a hill or not, however these variables can be observed and do affect the performance of the switching system.

In order to provide more accurate optimisations it is desirable to take environmental variables (e.g. temperature) into account since these variables affect the performance of the switching device. However capturing this information in the optimisation method discussed above is challenging.

The method of Bayesian Optimisation discussed above assumes that all of the input variables are controllable. During the method of FIG. 2 a next query point is determined by searching the input space for a set of input variables (i.e. an x value) that maximises an acquisition function. In the case where the input variables are multi-dimensional and comprise at least one design variable (e.g. a vector with multiple components, one of which represents a gate driver signal) and at least one environmental variable (e.g. a vector with multiple components, one of which is a temperature), this step could be viewed as determining, amongst other things, a next gate driver signal to apply and a next temperature to apply. However, it is not generally possible to control the temperature in this way since the temperature can only be observed, and not controlled. Consequently, known optimisation techniques do not account for variables (e.g. environmental variables) that cannot be controlled, leading to inferior performance when modelling systems that depend on the value of these environmental variables. In light of this a new optimisation technique is required.

Figure 4A:
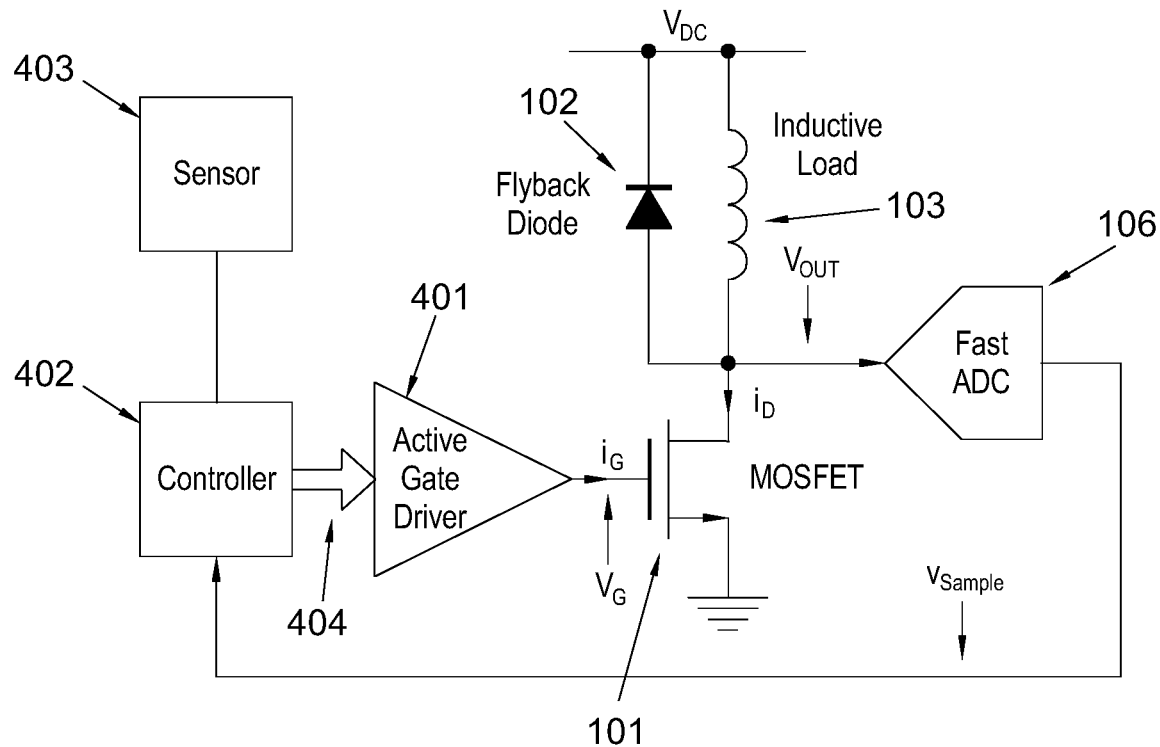
FIG. 4A shows an electronic system according to an example.

FIG. 4A shows an electronic system according to an example. FIG. 4A uses the same reference numerals as FIG. 1A to denote same components. As a result, a detailed discussion will be omitted for the sake of brevity.

The system of FIG. 4A also comprises a controller 402, a sensor 403 and an Active Gate Driver 401. The sensor 403 is communicatively coupled to the controller 402, and is configured to observe (e.g. by measuring) an environmental variable (e.g. temperature). The controller 402 is configured to determine a value for the environmental variable based on an output of the sensor 403.

The controller 402 is also configured to determine a metric based on samples outputted by an output sampler. In an example the output samples are provided to the controller 402 by an output sampler that samples (i.e. measures) the Drain voltage ($V_D$) using an Analogue-to-Digital Converter (ADC), optionally using the fast ADC 106. Additionally or alternatively the output sampler is configured to sample the Drain current ($I_D$) using a current sensor (not shown).

In an example the metric determined by the controller 402 is the current overshoot that occurs during switching the switching device 101. In another example the metric is the energy loss that occurs while changing the states of the switching device 101 (i.e. the switching losses). In particular, the energy loss during turn-on of the switching device 101.

In a further example, the metric determined by the controller 402 is a combination of the current overshoot and the switching losses. The current overshoot and the switching losses represent a trade-off, in the sense that minimising the energy losses can be at the expense of increasing current overshoot and vice versa. Consequently, in an example, a combined cost is computed and minimised. In an example the combined cost is calculated according to the sum of a current overshoot value and a value of the switching losses. In another example the combined cost is the Root Mean Square (RMS) of the current overshoot value and the switching losses.

The controller 402 is further configured to perform optimisation of the gate driver signal according to the methods described below. In particular, the controller 402 is configured to generate a surrogate model of the objective function based on: the readings obtained by the sensor 403, the metrics determined by sampling an output of the switching device, and the generated gate driver signals. The controller 402 is further configured to determine a gate driver signal (or information specifying a gate driver signal) that optimises the surrogate model.

In the case where an appropriate number of optimisation iterations are performed, the surrogate model will accurately follow the unknown objective function, $f$, (that describes how a metric such as the current overshoot changes with the input parameters). As a result, determining a value that optimises the surrogate model will result in a value that optimises the objective function, $f$. In the case where the optimisation is to find a minimum value, and the objective function, $f$, represents the current overshoot for different input variables, finding a value that optimises the surrogate model comprises determining a value of the input variables that minimises the current overshoot of the switching circuit.

Finally, the controller 402 is configured to output information specifying the gate driver signal 404. This information is used both during the "optimisation phase" (i.e. when the surrogate model is being refined and the input space is being explored) and during a "use phase" where the surrogate model is evaluated to generate the optimised gate drive signal.

Information specifying the gate driver signal 404 can take many forms. In one example, the gate drive signal is specified, by the controller 402, using four variables. The variables include: a first level, $N_1$, a first time period, $t_1$, a second level, $N_2$, and a second time period, $t_2$. The variables characterise the gate driver signal ($V_G$), and define a waveform that takes a first signal level, $N_1$, for the first time period, $t_1$, and takes the second signal level $N_2$ for the second time period $t_2$, where the second time period, $t_2$, immediately follows the first time period, $t_1$.

The Active Gate Driver 401 is configured to operate the switching device 101 by generating a customised waveform. In particular, the Active Gate Driver 401 is configured to receive the information specifying the gate driver signal 404 at an input and generate a gate driver signal ($V_G$) at an output based on the received information. Optionally the Active Gate Driver 401 is implemented using a plurality of clocked gate drivers, each with a 63-level programmable driveability (i.e. each gate driver in the plurality of gate drivers can be configured to output one of 63 voltage levels).

Figure 4B:
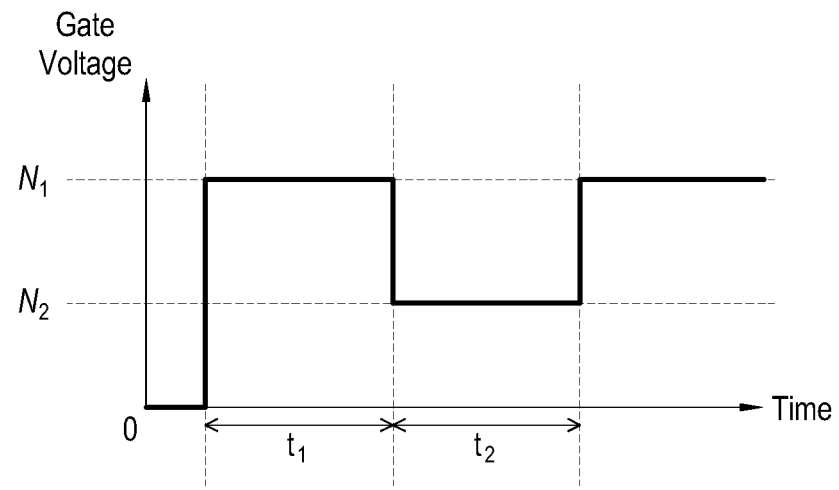
FIG. 4B shows a gate drive signal generated by the Active Gate Driver 401 according to an example.

FIG. 4B shows a gate drive signal generated by the Active Gate Driver 401 according to an example. In an example, the Active Gate Driver 401 is configured to receive the information specifying the gate driver signal 404 from the controller 402 in the form of four variables that include: the first level, $N_1$, the first time period, $t_1$, the second level, $N_2$, and the second time period, $t_2$.

In an example the first level, $N_1$, and the second level, $N_2$, are specified as a number, optionally between 0 and 63 (inclusive) that define a voltage to be outputted for the respective time period. In an example, the first time period, $t_1$, and the second time period, $t_2$, provide a value, specified in nanosecond precision, indicating a duration of time to apply the respective voltage level. In response to receiving the four variables, the active gate driver 401 is configured to generate a gate drive waveform (e.g. by converting the first and second level numbers that take a value between 0 and 63 (inclusive) to a voltage value and applying these voltage values to the gate of the switching device 101 for the specified duration).

The variables ($N_1$, $t_1$, $N_2$, $t_2$) define the voltage waveform used while switching states of the switching device 101. The voltage applied by the active gate driver 401 before the start of the first time period $t_1$ (i.e. before the switch) and after the second time period $t_2$ (i.e. after the switch) is user defined.

Each choice of the variables ($N_1$, $t_1$, $N_2$, $t_2$) generates a different gate driver waveform at the switching device, and could result in a different switching behaviour (e.g. a different switching energy loss, or a different current overshoot).

As discussed above, the sensor 401 is configured to measure/observe an environmental variable. Examples of environmental variables measured by the sensor include, but are not limited to: the temperature of the device, the supply voltage ($v_{DC}$) and the load current. It will be appreciated that the sensor 401 may include a plurality of individual components for measuring the respective environmental variables.

Figure 5:
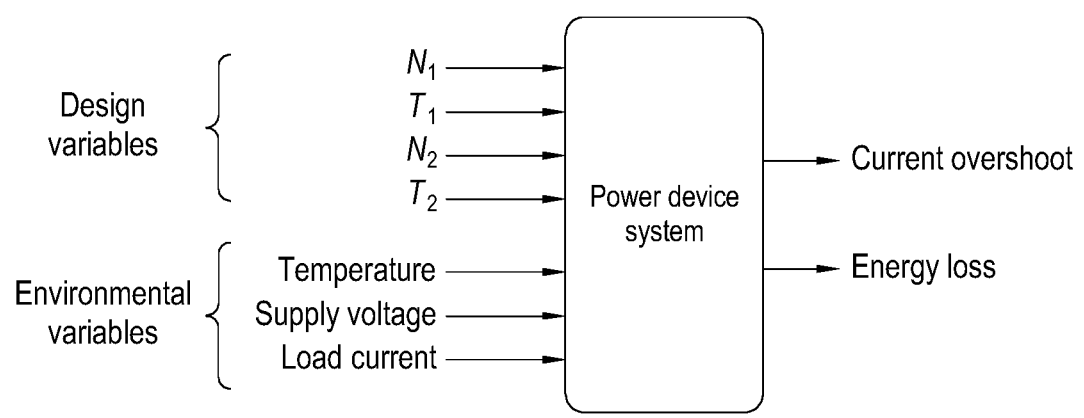
FIG. 5 shows a black box representation of the electronic system according to an example.

FIG. 5 shows a black box representation of the electronic system according to an example. The black box representation shown in FIG. 5 includes input variables that affect the value of the function (i.e. input variables that affect the switching behaviour). The black box representation of FIG. 5 also includes an output generated by the function (e.g. the current overshoot and/or the energy loss observed as a result of applying the input variables during a switching event).

When environmental variables (such as temperature) are included in the optimisation the function to optimise can be written as $f(x^{(d)}, x^{(e)})$. Where $x^{(d)}$ are the design variables (such as gate driver waveform) that can be controlled and $x^{(e)}$ are the environmental variables which are observable but not controllable. In this way, the input variables (to the objective function, $f$) comprise the design variables, $x^{(d)}$, and the environmental variables, $x^{(e)}$.

In an example, the design variables, $x^{(d)}$, comprise variables that characterise the gate drive signal (i.e. $x^{(d)}=(N_1,T_1,N_2,T_2)$) and the environmental variables, $x^{(e)}$, comprise a value for each of the temperature, T, the supply voltage, $V_s$, and the load current, Ig (i.e. $x^{(e)}=(T,V_s,I_g)$).

Figure 6:
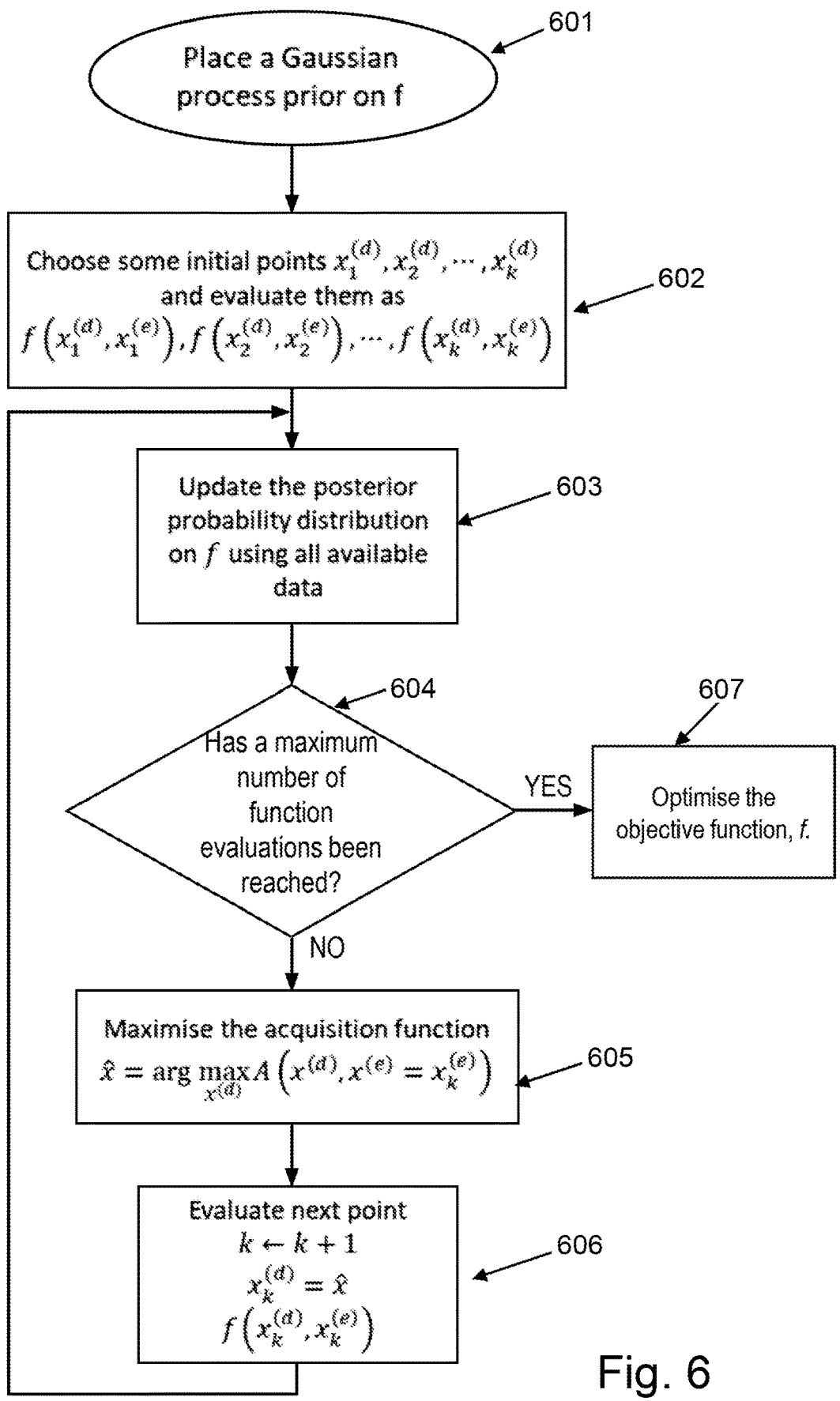
FIG. 6 shows a method of optimising a gate driver signal according to an example.

FIG. 6 shows a method of optimising a gate driver signal according to an example. The method begins in step 601 by placing a Gaussian process prior probability distribution on the (unknown) objective function, $f$. This step is similar to step 201 in FIG. 2. As a result, a detailed discussion will be omitted. However, in essence step 601 comprises modelling the unknown objective function, $f$, as a Gaussian Process where each value in the input space (i.e. each value of the input variables) is associated with a probability distribution indicating the range of function values that the (unknown) objection function, $f$, could take at the given point. After placing a Gaussian process prior probability distribution on the (unknown) objective function, $f$, the method proceeds to step 602.

In step 602, at least one initial point in the input space is selected and the objective function, $f$, is evaluated. The input variables comprise design variables, $x^{(d)}$, and environmental variables, $x^{(e)}$. As discussed above, environmental variables, $x^{(e)}$, cannot generally be controlled.

As a result, when selecting the at least one initial point it is normally not possible to specify the environmental variables, $x^{(e)}$ and proactively/explicitly input these into the system (as modelled by the objective function, $f$). Instead the environmental variables, $x^{(e)}$, are generally inputted into the function implicitly. Put in other words, the switching device 101 is already experiencing the environmental variables (e.g. it is already experiencing a temperature, and this temperature cannot be controlled). As a result, the variables are said to be implicitly inputted into the function because they are already being applied to the system (without any explicit action required). Contrast this with the design variables, $x^{(d)}$, which specify the gate driver signal and actually require the Active Gate Driver 401 to explicitly input the gate driver signal ($V_G$) in order to evaluate the objective function, $f$.

As a result, selecting an initial point to evaluate the objective function comprises selecting a value of the design variables at a first time, $x_1^{(d)}$ and observing the environmental variables at a first time, $x_1^{(e)}$.

The design variables of the at least one initial point (i.e. $x^{(d)}$) may be generated by randomly selecting values of the design variables, $x^{(d)}$. For example, by randomly selecting values of: $N_1$, $T_1$, $N_2$, $T_2$. The randomly selected design variables, $x^{(d)}$ are used to evaluate the objective function, $f$ (e.g. by the controller 402 providing the randomly selected design variables, $x_1^{(d)}$, to the Active Gate Driver 401, the Active Gate Driver 401 generating a gate driver signal ($V_G$), observing the behaviour of the switching device 101 (e.g. using a current sensor) and calculating the metric (e.g. the current overshoot) based on the observations).

As discussed above, the environmental variables $x_1^{(e)}$ are implicitly inputted when the objective function, $f$, is evaluated. Consequently, determining the metric after explicitly inputting the gate driver signal is equivalent to evaluating the objective function at $f(x_1^{(d)}, x_1^{(e)})$. Although there is no specific input required to evaluate the objective function at $x_1^{(e)}$, it is noted that the values of the environmental variables (i.e. the value of $x_1^{(e)}$) when the function is evaluated (i.e. when the gate driver signal is used to drive the switching device) are still observed (e.g. using the sensor 403) in order to use this information when building the surrogate model.

After observing the objective function at least one point in the input space (i.e. at $f(x_1^{(d)},x_1^{(e)})$), the method proceeds to step 603.

In step 603 the posterior probability distribution on the objective function, $f$, is updated using the evaluations obtained in step 602 in the same way as discussed above in relation to step 203. In particular, the surrogate model (modelling the (unknown) objective function) is first updated at a point in the multi-dimensional input space (specifically at point $x^{(d)}$, $x^{(e)}$) so that the mean function of the surrogate model at that point equals the observation (i.e. so that the mean function of the surrogate model at point $x_1^{(d)}$, $x_1^{(e)}$ equals $f(x_1^{(d)}, x_1^{(e)})$. Furthermore, the standard deviation at that point is set equal to zero. In this case it is assumed that the observation of the objective function (i.e. $f(x_1^{(d)}, x_1^{(e)})$ contains no noise and the observed value is the true value of the (unknown) objective function, $f$.

After updating the surrogate model using the observations, the posterior probability distribution of the objective function, $f$, at the remaining points in the input space is updated (e.g. using Bayes' rule as discussed in relation to step 203). The method proceeds to step 604.

In step 604 the method determines whether a maximum number of function evaluations, N, has been performed. Put more generally, in step 604 it is determined whether the optimisation algorithm should stop (i.e. whether the surrogate model being updated by sampling points and updating the posterior probability distribution should now be exploited to find an optimum value of the objective function, $f$). In the example of FIG. 6 the criteria used to determine whether to stop updating the surrogate model is whether a predetermined number of function evaluations, N, has been performed. However, it is emphasised the other criteria could be used. For example, in one example the criteria is whether a predetermined number of iterations of the optimisation method have been performed. In another example the criteria is whether the objective function, $f$, reaches a predetermined target, that is to say, whether the value obtained by evaluating the objective function, $f$, is less than the predetermined target. In another example the criteria used to determine when to stop updating the surrogate model is whether a smaller value of the objective function, $f$, has not been obtained for a certain number of iterations.

The method proceeds to step 605 in response to determining that a maximum number of function evaluations has not been performed.

In step 605 an acquisition function, A, (e.g. using a technique such as "expected improvement" or "probability of improvement") is generated/updated based on the updated posterior probability distribution.

As a reminder, the acquisition function, A, provides an indication of a metric across the input space. For example, where the acquisition function is generated according to "expected improvement", the acquisition function indicates, for each point in the input space (i.e. for each combination of design and environmental variables), what the expected improvement in the metric is, relative to the current minimum value of the metric. Since the aim in this example is to minimise the objective function, $f$, an improvement is a smaller value of the metric.

In step 605, like in step 204, the acquisition function, A, is maximised. However, unlike in step 204, the acquisition function is not maximised across all input variables. Instead, the acquisition function is only optimised over the controllable variables, which in this example, are the design variables, $x_1^{(d)}$. In this case the environmental variables, $x^{(e)}$, are set equal to a predicted value (e.g. a value that the environmental variables, $x^{(e)}$, are predicted to be at when the objective function, $f$, is next evaluated).

In one example the predicted value of the environmental variables $x^{(e)}$, is set equal to the last observed value of the environmental variables $x_k^{(e)}$, which in the example above where there is only one function evaluation in step 602 is $x_1^{(e)}$. Setting the environmental variables $x^{(e)}$ equal to the last known values of the environmental variables $x_1(e)$ is advantageous because it is a low complexity solution and, in practice, environmental variables (such as temperature) change slowly and so the last observed value is a good estimate. In this case maximising the acquisition function can be summarised as:

$$\hat{x} = \underset{x^{(d)}}{\mathrm{argmax}} A\big(x^{(d)}, x^{(e)} = x_k^{(e)}\big)$$

Where $\hat{x}$ is the next query point and comprises the design variables $x^{(d)}$ that maximise the acquisition function, A, for the predicted environmental variables, $x_k^{(e)}$.

In another example, the predicted value of the environmental variables, $x^{(e)}$, (e.g. the predicted temperature) is generated using a predictive model that generates a predicted value based on a set of previous values.

By constraining the maximisation of the acquisition function to be over a constant set of environmental variables (i.e. a predicted value of the environmental variables), the method of FIG. 6 is able to optimise a model of the system that includes environmental variables in a way that can be implemented (i.e. it allows optimisation of a system model that includes variables that are observable but not controllable).

The method proceeds to step 606 after maximising the acquisition function in step 605 and obtaining the next query point, $\hat{x}$. In step 606 the objective function, $f$, is evaluated at the next query point (i.e. using the value of the design variables, $\hat{x}$ obtained in step 604). The environmental variables, $x_k^{(e)}$, are recorded/observed when the switching device 101 is switched according to the design variables $x_k^{(d)}$. As discussed above, at this point the environmental variables are implicitly inputted into the function. Consequently, the metric determined based on the output of the switching device (e.g. the current overshoot) represents the objective function value: $f(x_k^{(d)}, x_k^{(e)})$.

After evaluating $f(x_k^{(d)}, x_k^{(e)})$ the method proceeds to step 603 where the posterior probability distribution is updated according to the function value, $f(x_k^{(d)}, x_k^{(e)})$, as discussed previously.

Returning to step 604. If it is determined in step 604 that a maximum number of function evaluations, N, have been performed, then the method proceeds to step 607. In step 607 the surrogate model is optimised. In an example, optimising the surrogate model comprises determining a set of design variables, $x^{(d)}$, for a predicted set of environmental variables, $x^{(e)}$, that minimises the (unknown) objective function, $f$, (as represented by a mean function of the surrogate model).

In an example where the objective function, $f$, represents the current overshoot, this step involves determining a value of the design variables (e.g. a gate drive signal) that minimises the current overshoot of the switching device 101. This step can be described as "using" the surrogate model, as opposed to steps 603, 605, and 606 which relate to "building" the surrogate model. The predicted set of environmental variables, $x^{(e)}$, used in step 607 can be generated using a previously observed environmental variable, a value predicted by a model or a current observed value.

Advantageously, modelling the objective function, $f$, over environmental variables improves the optimisation since variables are taken into account that affect the value of the objective function, $f$, leading to more accurate optimisations. As discussed above, expanding the dimensionality of the model to include environmental variables can be problematic for previous optimisation techniques since it is not generally possible to optimise these values (i.e. these values cannot generally be controlled). To solve this problem the method of FIG. 6 evaluates an acquisition function with a fixed value of the environmental variables, e.g. a predicted value of the environmental variables. In this way, the objective function can be explored in a way that is practical (i.e. the optimisation is not attempting to explore points in the input space associated with environmental variables, such as temperature, that cannot be obtained). In this way, the method of FIG. 6 enables the optimisation of more comprehensive system models (i.e. system models that include environmental variables).

Furthermore, the method of FIG. 6 has a lower complexity and a higher convergence rate than using a different optimisation for each value of the environmental variables. In particular, using a different optimisation for each value of the environmental variables could lead to many instances that need to be optimised, increased complexity, and a slower convergence rate since there are fewer function evaluations for each optimisation process (i.e. the N function evaluations are spread over each optimisation process). Furthermore, the method of FIG. 6 does not rely on a priori knowledge or very general assumptions to model the environmental variables which can lead to poor performance.

In the example above the aim was to minimise the objective function, $f$. Or put in other words, the problem was of the form $$\min_{x \in S} f(x)$$

(i.e. to find a minimum of the function, $f$). In this case an example acquisition function, A, was configured to indicate a probability of improvement or an expected improvement with respect to the current minimum observed value of the objective function, where an improvement is associated with a smaller/lower value of the objective function. Furthermore, in step 607 the objective function, $f$, was optimised by finding a set of design variables, $x^{(d)}$, that minimised the objective function.

It will be appreciated that optimisation method discussed above could also be used where the aim is to maximise the objective function, $f$, where the problem is of the form of the form $$\max_{x \in S} f(x).$$

In this case an example acquisition function, A, is configured to indicate a probability of improvement or an expected improvement with respect to the current maximum observed value of the objective function, where an improvement is associated with a larger/higher value of the objective function. Furthermore, in step 607 the objective function, $f$, is optimised by finding a set of design variables, $x^{(d)}$, that maximises the objective function.

Figure 7:
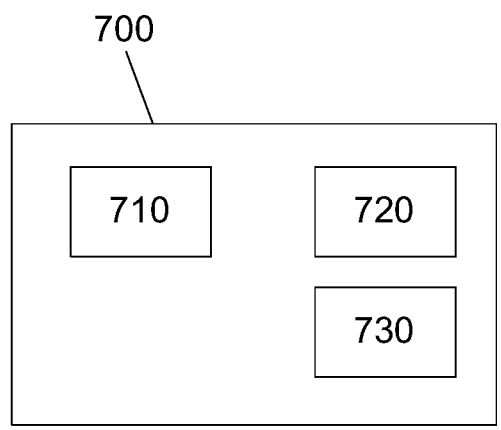
FIG. 7 shows a controller according to an example.

FIG. 7 shows a controller according to an example. The controller 700 comprises an input/output module 710, a processor 720 and a non-volatile memory 730. The input/output module 710 is configured to communicate with a sensor and a sampler, optionally to receive sensor readings/measurements of the environmental variables and to receive samples from an output of the switching device (e.g. the current waveform or the voltage waveform). The processor 720 is coupled to the input/output module 710 and to the non-volatile memory 730. The non-volatile memory 730 stores computer program instructions that, when executed, cause the processor 720 to execute program steps that implement the functionality of a controller as described in the above-methods.

In an example, the non-volatile memory 730 stores computer program instructions that, when executed, cause the processor 720 to determine a metric associated with the switching device (e.g. the current overshoot), obtain values of the environmental variables, build a surrogate model of the objective function, $f$ (modelling the behaviour of the switching system with respect to the metric), and to optimise the objective function, $f$, (as modelled by the surrogate model).

A number of use-cases exist for the above-described methods and systems. For example, Active Gate Driver (AGD) systems as described above could be used in electric vehicles, power tools, cooling systems, etc.

In the example above, the current overshoot during a switch-on of a MOSFET is discussed as a metric. However, it is emphasised that the metric is not so limited. For example, the metric could relate to the switching behaviour of any electronic switch, and could relate to switch-on and switch-off events. Furthermore, in the case of a MOSFET during a switch-off event, the metric may be the voltage overshoot.

Furthermore, in the examples above the optimisation algorithm is discussed in relation to determining a gate driver signal that optimises a given metric (e.g. the current overshoot). However it is emphasised that the methods discussed above are not limited to use in power electronics devices, but could instead be used for any optimisation problem with environmental variables (i.e. variables that can be observed but not controlled).

Finally, in the examples above there is provided one surrogate model to optimise a metric (either a single metric (e.g. current overshoot), or a combined metric (e.g. the sum of current overshoot and energy loss)). In another example the method involves optimising two separate output metrics (e.g. a current overshoot and an energy loss) generated by a single surrogate model using a multi-objective optimisation to consider them jointly as described in "Moradpour, M., Pirino, P., Losito, M., Franke, W.-T., Kumar, A., & Gatto, G. (2020). Multi-Objective Optimization of the Gate Driver Parameters in a SiC-Based DC-DC Converter for Electric Vehicles. Energies, 3720-3713", which is incorporated herein by reference.

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A method for active gate driving a switching circuit, wherein:
a characteristic of a waveform controlled by the switching circuit is represented by a function mapping an input variable to an output metric, wherein:
the input variable comprises:
a design variable having a first set of possible values; and
an environmental variable having a second set of possible values, wherein the environmental variable is observable but not controllable;
the method comprising:
performing Bayesian optimisation on the function to generate a model of the function, wherein a next value of the design variable for evaluating the function is selected based on values of an acquisition function associated with a predicted value of the environmental variable;
determining a first value of the design variable that optimises the model of the function; and
controlling the switching circuit according to the first value of the design variable.

2. The method according to claim 1, wherein the next value of the design variable is selected based solely on the values of the acquisition function associated with the predicted value of the environmental variable.

3. The method according to claim 1, wherein the model of the function comprises a mapping from: each combination of the first set of possible values and the second set of possible values, to: the output metric.

4. The method according to claim 1, wherein the output metric is one of: a current overshoot, a voltage overshoot, or a switching energy loss.

5. The method according to claim 1, wherein the design variable comprises information identifying a switching waveform.

6. The method according to claim 5, wherein the switching circuit comprises a MOSFET and wherein the switching waveform is a voltage waveform applied to a gate of the MOSFET.

7. The method according to claim 1, wherein
performing Bayesian optimisation on the function to generate a model of the function, comprises:
generating a prior probability distribution of the function by modelling the behaviour of the switching circuit as a Gaussian process;
evaluating the function with a second value of the design variable and a first value of the environmental variable to generate a first evaluation;
generating a posterior probability distribution of the function based on the prior probability distribution and the first evaluation;
generating an acquisition function based on the posterior probability distribution, wherein the acquisition function comprises an indication of how an input space, comprising each combination of the first set of possible values and the second set of possible values should be explored;
determining the next value of the design variable by maximising the acquisition function based on the predicted value of the environmental variable;
evaluating the function with the next value of the design variable and a second value of the environmental variable to generate a second evaluation; and
updating the posterior probability distribution of the function based on the second evaluation.

8. The method according to claim 7, wherein evaluating the function with the second value of the design variable and the first value of the environmental variable to generate the first evaluation comprises:
generating a gate drive signal based on the second value of the design variable;
applying the gate drive signal to an input of the switching circuit;
sampling an output of the switching circuit to generate a sampled output;
determining the output metric based on the sampled output; and
setting the first evaluation equal to the output metric.

9. The method according to claim 8, wherein the metric is based on a combination of a current overshoot and a switching energy loss.

10. The method according to claim 7, wherein generating a prior probability distribution of the function comprises determining, for each combination of the first set of possible values and the second set of possible values, a probability distribution of the values that the function could take at the respective point.

11. The method according to claim 7, wherein the acquisition function indicates an expected improvement in the output metric associated with each combination of the first set of possible values and the second set of possible values relative to a current combination of the first set of possible values and the second set of possible values associated with a lowest output metric.

12. The method according to claim 11, wherein determining the next value of the design variable comprises:
determining a first set of values of the acquisition function associated with the predicted value of the environmental variable;
identifying a value in the first set of values associated with a lowest value; and
setting the next value of the design variable equal to a value of the design variable associated with the highest value.

13. The method according to claim 7, wherein the predicted value of the environmental variable is the first value of the environmental variable.

14. The method according to claim 1, wherein determining the first value of the design variable that optimises the model of the function comprises: identifying a minimum value of a mean function associated with the model of the function; and setting the first value of the design variable equal to a design variable associated with the minimum value of the mean function.

15. A device for active gate driving a switching circuit, wherein:
a characteristic of a waveform controlled by the switching circuit is represented by a function mapping an input variable to an output metric, wherein:
the input variable comprises:
a design variable having a first set of possible values; and
an environmental variable having a second set of possible values, wherein the environmental variable is observable but not controllable;
the device configured to:
perform Bayesian optimisation on the function to generate a model of the function, wherein the device is configured to select a next value of the design variable for evaluating the function based on values of an acquisition function associated with a predicted value of the environmental variable;
determine a first value of the design variable that optimises the model of the function; and
control the switching circuit according to the first value of the design variable.

16. The device according to claim 15, wherein the device is configured to select the next value of the design variable based solely on the values of the acquisition function associated with the predicted value of the environmental variable.

17. The device according to claim 15, wherein the model of the function comprises a mapping from: each combination of the first set of possible values and the second set of possible values, to: the output metric.

18. The device according to claim 15, wherein the output metric is one of: a current overshoot, a voltage overshoot, or a switching energy loss.

19. The device according to claim 15, wherein the design variable comprises information identifying a switching waveform.

20. A non-transitory computer-readable medium comprising computer program instructions suitable for execution by a processor, the instructions configured, when executed by the processor, to:
perform Bayesian optimisation on a function to generate a model of the function, wherein a next value of a design variable for evaluating the function is selected based on values of an acquisition function associated with a predicted value of an environmental variable;

determine a first value of the design variable that optimises the model of the function; and control a switching circuit according to the first value of the design variable, wherein:

a characteristic of a waveform controlled by the switching circuit is represented by the function mapping an input variable to an output metric, and wherein:

the input variable comprises:

the design variable having a first set of possible values; and the environmental variable having a second set of possible values, wherein the environmental variable is observable but not controllable.

\* \* \* \* \*